United States Patent
Mok et al.

(10) Patent No.: US 9,412,974 B2
(45) Date of Patent: Aug. 9, 2016

(54) DISPLAY DEVICE USING PHOTONIC CRYSTAL

(71) Applicant: SAMSUNG DISPLAY CO., LTD., Yongin, Gyeonggi-Do (KR)

(72) Inventors: Rang-Kyun Mok, Songpa-gu (KR); Ki-Seo Kim, Chungcheongnam-do (KR)

(73) Assignee: Samsung Display Co., Ltd., Yongin-si (KR)

( * ) Notice: Subject to any disclaimer, the term of this patent is extended or adjusted under 35 U.S.C. 154(b) by 137 days.

(21) Appl. No.: 13/924,509

(22) Filed: Jun. 21, 2013

(65) Prior Publication Data

US 2014/0231758 A1    Aug. 21, 2014

(30) Foreign Application Priority Data

Feb. 18, 2013 (KR) .................. 10-2013-0016834

(51) Int. Cl.
   *H01L 29/08* (2006.01)
   *H01L 51/52* (2006.01)
   *H01L 33/46* (2010.01)

(52) U.S. Cl.
   CPC ........ *H01L 51/5296* (2013.01); *H01L 51/5271* (2013.01); *H01L 33/46* (2013.01)

(58) Field of Classification Search
   CPC .......................... H01L 51/5296; H01L 51/5271
   USPC ....................................................... 257/40, 98
   See application file for complete search history.

(56) References Cited

U.S. PATENT DOCUMENTS

| | | | |
|---|---|---|---|
| 2007/0085100 A1* | 4/2007 | Diana et al. ................ | 257/98 |
| 2007/0159579 A1 | 7/2007 | Lee et al. | |
| 2011/0156000 A1* | 6/2011 | Cheng ................ | H01L 33/22 257/13 |
| 2011/0215355 A1* | 9/2011 | van de Ven ........... | H01L 33/505 257/98 |
| 2012/0139960 A1 | 6/2012 | Shin et al. | |
| 2013/0037843 A1* | 2/2013 | Yamao et al. .................. | 257/98 |

FOREIGN PATENT DOCUMENTS

| | | |
|---|---|---|
| KR | 2003-0085667 | 11/2003 |
| KR | 10-2010-0040650 | 4/2010 |
| KR | 10-2012-0063159 | 6/2012 |

OTHER PUBLICATIONS

Feldmeier, Eva J., *Multiple colour emission from an organic light-emitting transistor*, Organic Electronics, vol. 12, (2011), pp. 1165-1169.

* cited by examiner

*Primary Examiner* — Douglas Menz
(74) *Attorney, Agent, or Firm* — Lewis Roca Rothgerber Christie LLP

(57) ABSTRACT

A display device including a light emitting transistor, and a photonic crystal on the light emitting transistor.

18 Claims, 6 Drawing Sheets

DISPLAY DEVICE USING PHOTONIC CRYSTAL

CROSS-REFERENCE TO RELATED APPLICATION

This application claims priority to and the benefit of Korean Patent Application No. 10-2013-0016834 filed on Feb. 18, 2013, with the Korean Intellectual Property Office, the present disclosure of which is incorporated herein in its entirety by reference.

TECHNICAL FIELD

The present disclosure relates to a display device using a photonic crystal located on a light emitting transistor.

BACKGROUND

A display device displays an image using an element that emits light. Flat panel display devices have been widely used as display devices, where representative flat panel display devices include liquid crystal displays and organic light emitting display devices.

In the liquid crystal display, because the liquid crystal is not a self-emitting element, an additional light-emitting component, such as a backlight, is required. Light emitted from the backlight then passes through a color filter to express a color. Contrarily, because the organic light emitting display device uses a self-emitting organic light emitting diode, the organic light emitting display device does not use a backlight, has a simple structure, and has high light extraction efficiency. For this reason, the organic light emitting display device is in the spotlight.

In the display device, to express a desired color in one pixel, at least three subpixels, including red, green, and blue are used. That is, to express a desired color in one pixel, an amount of light emitted from each subpixel out of a red subpixel, a green subpixel, and a blue subpixel is controlled. In this case, a transistor is used to control the amount of light emitted from each of the red subpixel, the green subpixel, and the blue subpixel. As such, to express a desired color in one pixel, the display device requires at least three subpixels, and requires a transistor for each of the three subpixels. Therefore, at least three transistors are required in one pixel.

SUMMARY

The present disclosure discloses a display device having aspects of reducing a number of transistors while being able to express a desired color, and of expressing one desired color although only one transistor is used.

An embodiment of the present disclosure provides a display device including a light emitting transistor, and a photonic crystal on the light emitting transistor.

The light emitting transistor may include a substrate, a gate electrode on the substrate, a gate insulating layer on the gate electrode, a source electrode and a drain electrode spaced apart from the gate electrode by the gate insulating layer, and a light emitting layer between the source electrode and the drain electrode.

The light emitting layer may include an organic material.

The light emitted in the light emitting layer may vary as a function of a magnitude of a voltage applied to the gate electrode.

The light may be emitted from a side of the light emitting layer adjacent the source electrode when substantially no voltage is applied to the gate electrode, and wherein increasing a positive voltage applied to the gate electrode within a range of voltages may cause a position of the emitted light to move closer to a side of the light emitting layer adjacent the drain electrode.

The source electrode may include a cathode, and the drain electrode may comprise an anode.

The light emitted by the light emitting transistor may be reflected by the photonic crystal.

The photonic crystal may include a plurality of patterns on a base part.

The size of each of the patterns may increase in a direction from one side of the base part to an opposite side of the base part.

The patterns may include a concave groove shape.

The concave groove shape may be in a range from about 100 nm to about 300 nm.

The diameter of the concave groove shape may increase in a direction from one side of the base part to an opposite side of the base part.

The depth of the concave groove shape may be in a range from about 100 nm to about 200 nm.

The photonic crystal may include a plurality of fine particles on a base part.

The particle size of the fine particles may be in a range from about 100 nm to about 300 nm.

The particle size of the fine particles may increase in a direction from one side of the base part to an opposite side of the base part.

The light reflected from the photonic crystal may be displayed, wherein the displayed light at a region adjacent a source electrode may be a red-based light, and wherein the displayed light at a region adjacent a drain electrode may be a blue-based light.

The light reflected from the photonic crystal may be displayed, wherein the displayed light in a region adjacent a source electrode may be a blue-based light, and wherein the displayed light in a region adjacent a drain electrode may be a red-based light.

An embodiment of the present disclosure provides a display device including a light emitting transistor including a gate electrode, a gate insulating layer on the gate electrode, and a source electrode and a drain electrode spaced apart from each other on the gate insulating layer, and a light emitting layer between the source electrode and the drain electrode, and a photonic crystal on the light emitting transistor, wherein a position of light emitted in the light emitting layer may vary as a function of a voltage of the gate electrode, and wherein a wavelength of light reflected by the photonic crystal may vary as a function of a position of the reflected light.

In a display device according to an embodiment of the present disclosure, it is possible to express a desired color using one transistor. As a result, in the display device, the number of transistors can be reduced. Further, because a light emitting transistor has a good aperture ratio, efficient light emitting can be performed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
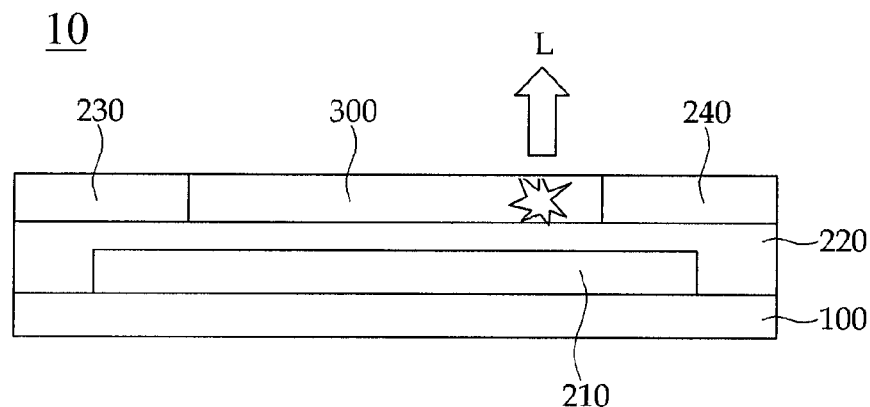
FIG. 1 is a diagram illustrating a structure of a light emitting transistor.

Hereinafter, embodiments of the present disclosure will be described in detail with reference to the accompanying drawings. However, the scope of the present invention is not limited to the following embodiments and drawings. Various equivalences and modifications may be made to the contents described below and the embodiments illustrated in the drawings.

The terminologies of this specification are those used to express embodiments of the present invention. Sometimes different terminologies may be used to express the same thing depending on the intention of users or operators, or depending on the custom in the art to which the present disclosure belongs. Accordingly, the terminologies may be defined based on the specification of present disclosure.

For reference, components and shapes thereof are drawn and may be exaggerated in the accompanying drawings for ease of understanding. Elements having the same or similar function are denoted by the same reference numerals in different embodiments.

Further, it will be understood that when a layer or an element is described as being "on" another layer or element, it may be directly located on another layer or element, or one or more intervening layers or elements may also be present.

A display device according to an embodiment of the present disclosure may include a light emitting transistor 10, and a photonic crystal 400 located on the light emitting transistor.

In FIG. 1, an example of the light emitting transistor 10 is illustrated. The light emitting transistor 10 includes a substrate 100, a gate electrode 210 located on the substrate 100, a gate insulating layer 220 located on the gate electrode 210, a source electrode 230 and a drain electrode 240 spaced apart from the gate electrode 210 by the gate insulating layer 220, and a light emitting layer 300 located between the source electrode 230 and the drain electrode 240. Here, the gate electrode 210 is electrically insulated from the source electrode 230 and the drain electrode 240 by the gate insulating layer 220.

In the described embodiment, the light emitting layer 300 comprises an organic material. That is, the light emitting layer 300 is an organic light emitting layer. The light emitting layer 300 may comprise an inorganic material, and the light emitting layer 300 may be an inorganic light emitting layer.

The light emitting layer 300 may correspond to an active layer of a thin film transistor (TFT). That is, the light emitting layer 300 corresponds to a semiconductor layer which is the active layer of the thin film transistor. Accordingly, when the light emitting layer 300 is made of an inorganic light emitting material, the light emitting layer 300 may serve as an inorganic semiconductor layer. When the light emitting layer 300 is made of an organic light emitting material, the light emitting layer 300 may serve as an organic semiconductor layer.

In the light emitting transistor 10, a voltage is applied to the gate electrode 210, and as a magnitude of the voltage applied to the gate electrode 210 varies, a position where the light is emitted in the light emitting layer 300 varies. That is, a position on the light emitting layer 300 where light L is generated varies according to a gate voltage.

Figure 2A:
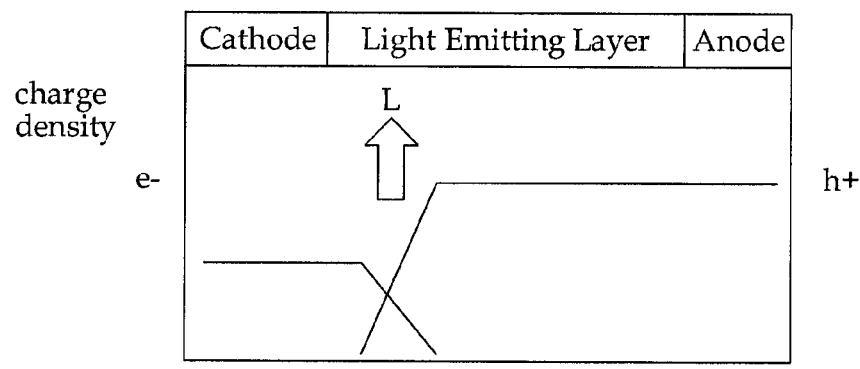
FIGS. 2A-2B are diagrams showing that light emitting positions of the light emitting transistor vary according to gate voltage.
Figure 2B:
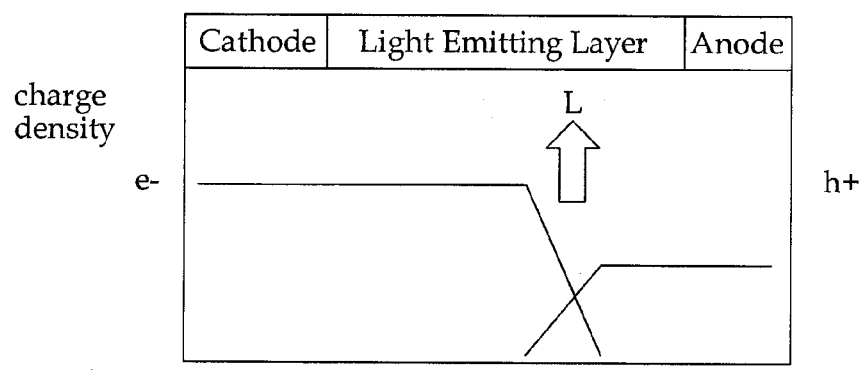

FIGS. 2A-2B are diagrams showing that a light emitting position of the light emitting transistor 10 varies according to a change of gate voltage. In FIGS. 2A-2B, the horizontal axis represents a position between a cathode and an anode, and the vertical axis represents density of charges (e.g., charge density).

According an embodiment of the present disclosure, in the organic light emitting layer, when the gate voltage is small or is substantially nonexistent, light is emitted at a position close to the cathode to generate light L (see FIG. 2A) because density and mobility of holes are higher than density and mobility of electrons. Contrarily, when positive voltage is applied to a gate, an n-channel is formed in the organic light emitting layer 300. As a result, the density and mobility of electrons are increased, and the light emitting position is changed. Thus a position where the light L is generated may vary (see FIG. 2B). Consequently, the light emitting position may be changed by controlling the gate voltage.

In the display device according to an embodiment of the present disclosure, the source electrode 230 serves as a cathode, and the drain electrode 240 serves as an anode.

Therefore, when the voltage is not applied to the gate electrode 210, the light is emitted at the source electrode 230 side (e.g., is emitted from a position adjacent the source electrode 230). However, when a positive voltage is applied to the gate electrode 210, as the voltage is increased, the position where the light is emitted moves toward the drain electrode 240 side (e.g., toward a side of the light emitting layer 300 adjacent the drain electrode 240).

The light emitting transistor 10 may be manufactured by a method conventionally known in the art. Those skilled in the art may design the light emitting transistor 10, or may modify a structure thereof.

Figure 3:
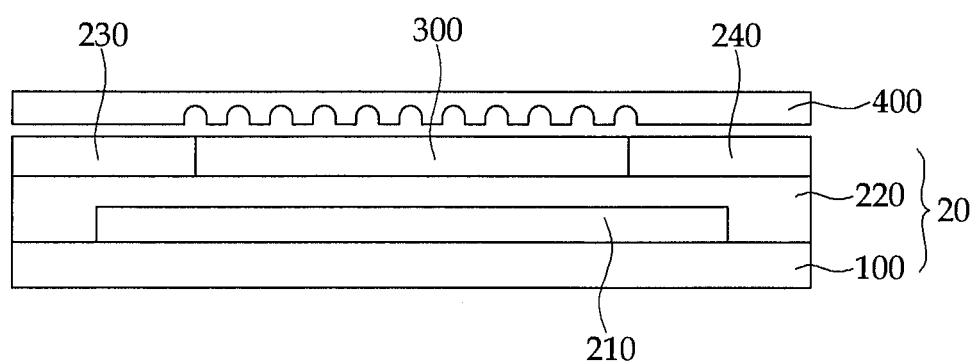
FIG. 3 is a diagram illustrating a structure of a display device according to an embodiment of the present disclosure.

FIG. 3 illustrates a structure of a display device according to an embodiment of the present disclosure, wherein a photonic crystal 400 is located on the light emitting transistor 20.

According to an embodiment of the present disclosure, light generated from the light emitting layer 300 of the light emitting transistor 20 is reflected from the photonic crystal 400. When the light is irradiated on a certain position of the photonic crystal, a certain wavelength of the light can be reflected. The wavelength of the light that can be reflected from the photonic crystal varies according to a size of a pattern or a size of fine particles of the photonic crystal. Because a certain wavelength of light is reflected and displayed at a certain position of the photonic crystal, a predetermined color of light can be displayed and expressed by the photonic crystal. According to another embodiment, a direction of the reflected light may also be controlled.

Figure 4A:
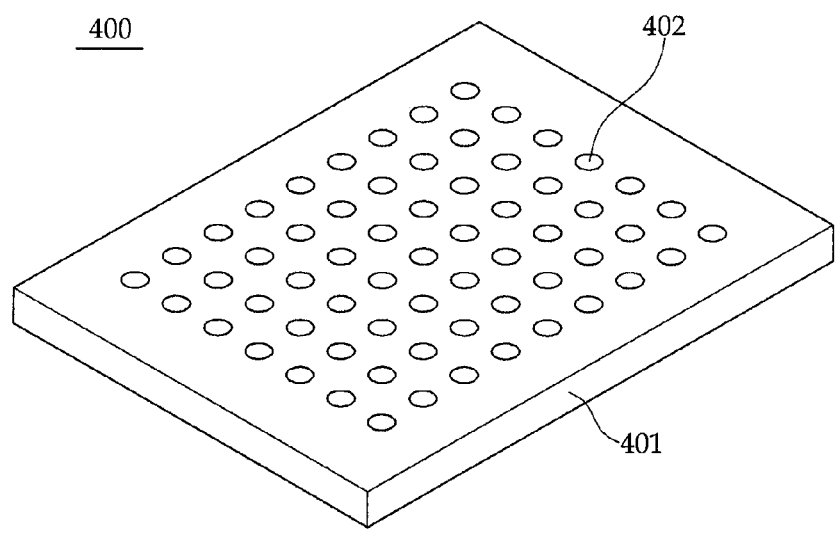
FIGS. 4A and 4B are a perspective view and a cross-sectional view, respectively, of a photonic crystal according to an embodiment of the present disclosure.
Figure 4B:
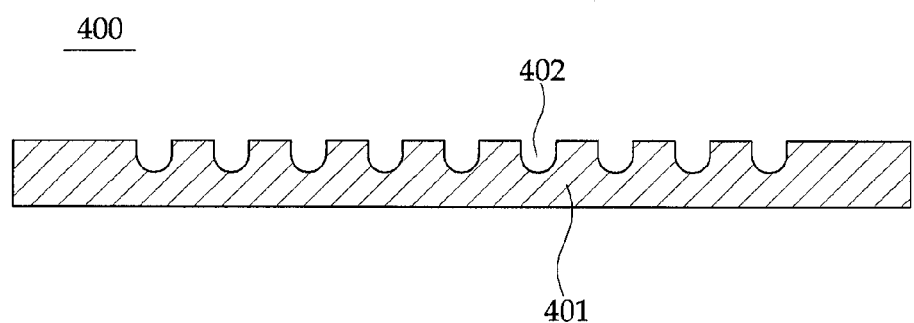

FIGS. 4A and 4B are a perspective view (FIG. 4A) and a cross-sectional view (FIG. 4B) of the photonic crystal 400 according to an embodiment of the present disclosure.

According to an embodiment of the present disclosure, the photonic crystal 400 may have structures wherein a plurality of patterns 402 is located on a base part 401. As illustrated in FIGS. 4A and 4B, the pattern 402 may be a concave groove structure.

In some embodiments, the concave groove structure may be in the shape of, for example, a concave lens, a cylinder, a prism, a cone, and a pyramid, and/or other shapes.

In some embodiments, a diameter of the concave groove may be in the range of about 100 nm to about 300 nm, and a depth of the concave groove may be in the range of about 100 nm to about 200 nm.

According to an embodiment of the present disclosure, a size of the pattern 402 may gradually increase from one side of the base part 401 to an opposite side of the base part 401. For example, in FIGS. 4A and 4B, the diameter of the concave groove, which is the pattern formed on the base part 401, may gradually increase when moving from a left side to an opposite right side of the base part 401.

In some embodiments, a wavelength of light that is reflected from the photonic crystal 400 can vary according to a size of the pattern formed at an area of the photonic crystal 400 where the light is reflected. Accordingly, when the size of the pattern 402 gradually changes (e.g., changes in a predetermined direction), various wavelengths of light can be reflected from the photonic crystal 400. For example, when white light is irradiated onto the photonic crystal 400, light having different wavelengths may be reflected from the photonic crystal 400 according to a size of the pattern 402 formed on a reflection area. As a result, all light in the visible light spectrum can be reflected.

In some embodiments of the present invention, the wavelength of the light reflected by the photonic crystal 400 may also be influenced by the type of material forming the photonic crystal based on the refractive index of the material. The material for forming the photonic crystal 400 may include materials having various refractive indexes.

As such, in some embodiments, the wavelength of the light reflected from the photonic crystal 400 may vary according to a size of the pattern formed on the photonic crystal 400, and according to a refractive index of the material for forming the photonic crystal. A method of calculating the wavelength of the light reflected from the photonic crystal 400 may include various methods such as, for example, a plane wave expansion method, a transfer matrix method, and/or a multiple scattering method. The wavelength of the light reflected from the photonic crystal 400 may be calculated by using the methods of calculating the wavelength. On the other hand, in a case when light having a specific wavelength is sought to be reflected, the material of the photonic crystal and the size of the pattern may be controlled according to the calculated result. For example, in the case of forming the photonic crystal 400 using a material having a refractive index of about 1.5 or more, when the white light is irradiated to the photonic crystal, a blue light may be reflected from an area where the size of the pattern is about 145 nm, a green light may be reflected from an area where the size of the pattern is about 180 nm, and a red light may be reflected from an area where the size of the pattern is about 216 nm.

In some embodiments of the present invention, when the material for forming the photonic crystal 400 varies, a size of the pattern for reflecting the same color may vary. Contrarily, when the material forming the photonic crystal 400 is the same material (e.g., is not varied), when the size of the pattern is small, light having a relatively short wavelength is reflected, and when the size of the pattern is large, light having a relatively long wavelength is reflected. That is, a smaller pattern size will cause a shorter wavelength of light to be reflected, and a larger pattern size will cause a longer wavelength of light to be reflected. For example, light having a blue-sided wavelength (e.g., a wavelength corresponding to the color blue/light that is a shade of blue) is reflected at the portion where the size of the pattern is smaller, and light having a red-sided wavelength is reflected at the portion where the size of the pattern is larger.

According to an embodiment of the present disclosure, a light emitting position in the light emitting transistor 20 may be controlled by controlling gate voltage. Thus, disposing the photonic crystal 400 on the light emitting transistor 20, and by controlling the light emitting position of the light emitting transistor 20 to control a position where reflection is performed on the photonic crystal, it is possible to selectively reflect a desired wavelength of light to display, or express a desired color. Further, when a distance between the light emitting transistor 20 and the photonic crystal 400 is very close, and because the light generated from a predetermined position of the light emitting transistor 20 may be reflected at the patterned portion of the photonic crystal 400 directly on the predetermined position of the light emitting transistor 20, the color may be controlled.

Figure 5:
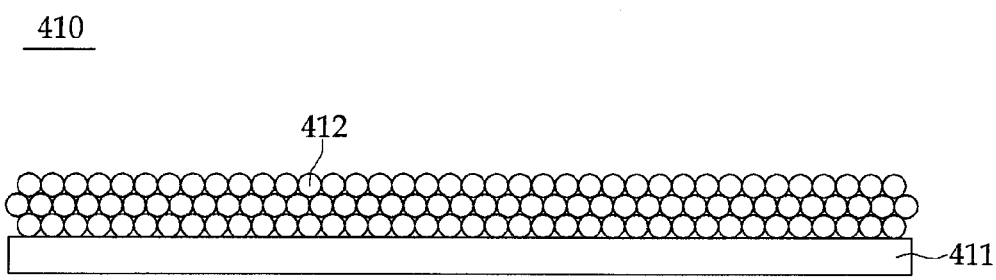
FIG. 5 is a diagram illustrating a cross section of a photonic crystal according to another embodiment of the present disclosure.

FIG. 5 illustrates another example of a photonic crystal 410 according to an embodiment of the present disclosure. The photonic crystal 410 illustrated in FIG. 5 has a structure where a plurality of fine particles 412 is located on a base part 411. A particle size of the fine particle 412 may be in the range of 100 nm to 300 nm.

Similar to the fine pattern illustrated in FIGS. 4A and 4B, the particle size of the fine particle 412 may be gradually increased from one side to the opposite side of the base part 411. According to the embodiment of the photonic crystal 410 illustrated in FIG. 5, light having a shorter wavelength is reflected when the size of the fine particle 412 is small. As the size of the fine particle 412 becomes larger, light having a longer wavelength is reflected. That is, light having a blue-sided wavelength is reflected when the size of the fine particle 412 is smaller, and as the size of the fine particle 412 becomes larger the corresponding wavelength of the reflected light moves toward the red end of the color spectrum.

In the display device according to an embodiment of the present disclosure, light emitted in a region adjacent the source electrode and reflected from a portion of the photonic crystal 410 positioned thereover may be a red-based light, and light emitted in a region adjacent the drain electrode and reflected from a portion of the photonic crystal 410 positioned thereover may be a blue-based light. On the contrary, light emitted in a region adjacent the drain electrode and reflected from a portion of the photonic crystal 410 positioned thereover may be red-based light, and light emitted in a region adjacent the source electrode and reflected from a portion of the photonic crystal 410 positioned thereover may be blue-based light. Thus, the reflected color may be changed by changing a layout position of the photonic crystal 410.

Figure 6:
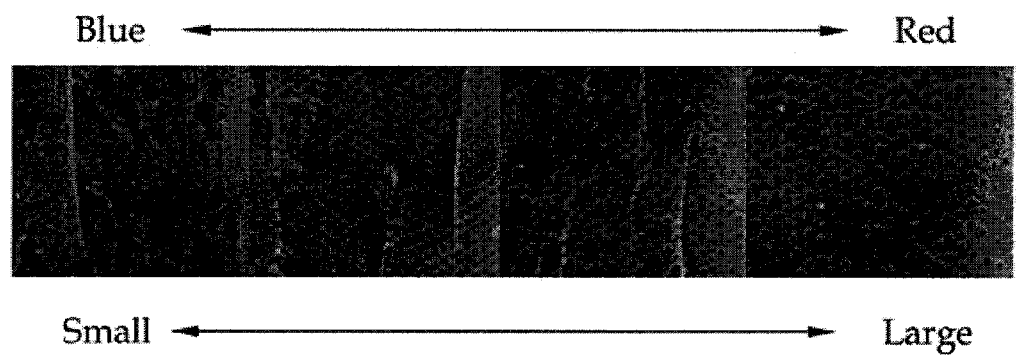
FIG. 6 is a diagram illustrating a relationship between a size of a pattern and reflected light in a photonic crystal according to an embodiment of the present disclosure.

FIG. 6 illustrates a relationship between a size of a pattern and reflected light in the photonic crystal 400 according to an embodiment of the present disclosure. As illustrated in FIG. 6, the photonic crystal may be formed so that when the size of the pattern is small, light having a blue-sided wavelength is reflected, and as the size of the pattern increases, light having a red-sided wavelength is reflected.

Figure 7:
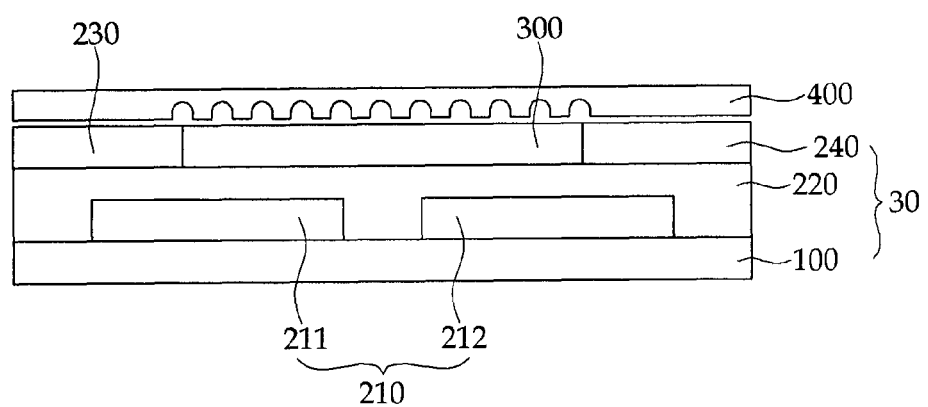
FIG. 7 is a diagram illustrating a structure of a display device according to another embodiment of the present disclosure.

FIG. 7 is a diagram illustrating a structure of a display device according to another embodiment of the present disclosure, wherein two gate electrodes 211 and 212 are located in the light emitting transistor 30. As such, when there are multiple gate electrode structures, the light emitting position in the light emitting layer 300 may be more accurately controlled because more than only the individual control of the density and mobility of the electrons may be controlled. Instead, the density and mobility of the holes may be controlled together.

Figure 8:
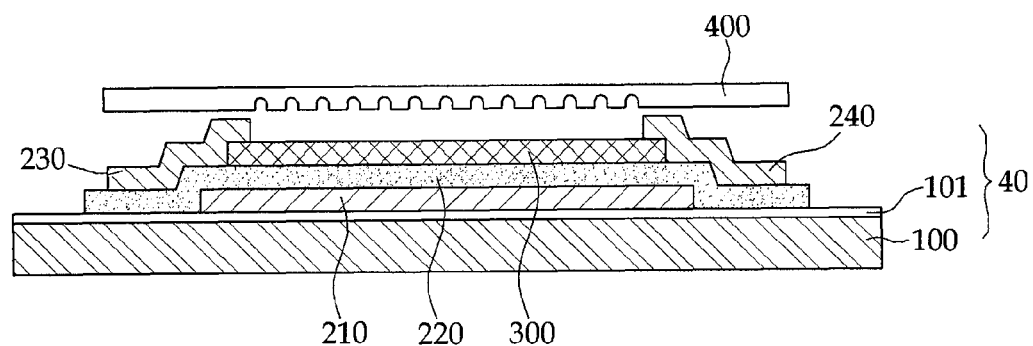
FIG. 8 is a diagram illustrating a light emitting transistor having a bottom gate structure according to an embodiment of the present disclosure.
Figure 9:
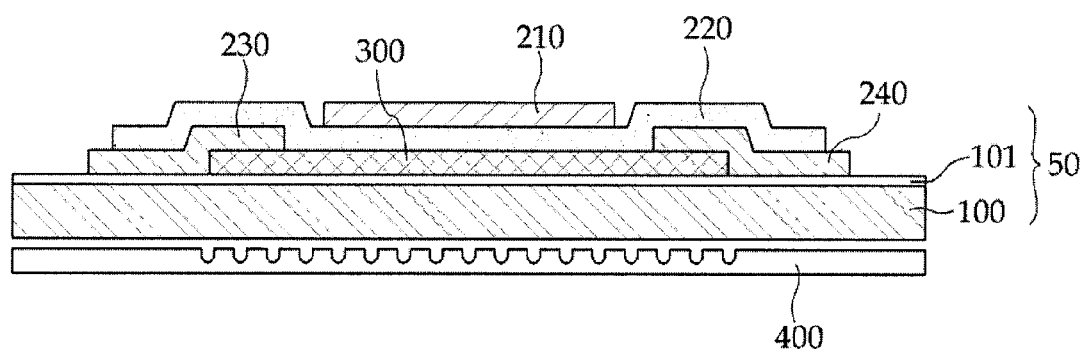
FIG. 9 is a diagram illustrating a light emitting transistor having a top gate structure according to another embodiment of the present disclosure.

FIGS. 8 and 9 illustrate structures of display devices according to other embodiments of the present disclosure. FIG. 8 illustrates an example of a display device including a light emitting transistor 40 having a bottom gate structure, and FIG. 9 illustrates an example of a display device including a light emitting transistor 50 having a top gate structure. The bottom gate structure and the top gate structure have different layout positions of the gate electrode of the light emitting transistor.

Referring to the embodiment of FIG. 8, the light emitting transistor 40 having the bottom gate structure includes a substrate 100, a buffer layer 101 located on the substrate, a gate electrode 210 located on the buffer layer 101, a gate insulating layer 220 covering the gate electrode 210, a light emitting layer 300 located on the gate insulating layer 220 correspondingly above the gate electrode 210, a source electrode 230 connected to one end of the light emitting layer 300, and a drain electrode 240 connected to the other end of the light emitting layer 300.

The substrate 100 may be formed by any one selected from, for example, a ceramic substrate, a silicon wafer, glass, plastic, and/or equivalences thereof. In some embodiments of the present invention, when the device is used for a bidirectional light emitting display device, the substrate 100 may be formed of a glass or a transparent plastic. The substrate made of glass may be formed by silicon oxide. The substrate made of the transparent plastic may be made of a polymer material such as polyethyleneterephthalate (PET), polyerylenenaphthalate (PEN), and/or polyimide.

The gate electrode 210 is located on a buffer layer 101 on the substrate 100. The gate electrode 210 may be made of reflective metal and/or may be made of a transparent material. When the gate electrode 210 is made of reflective metal, at least one selected from aluminum (Al), tin (Sn), tungsten (W), gold (Au), chromium (Cr), molybdenum (Mo), palladium (Pd), platinum (Pt), nickel (Ni), titanium (Ti), and/or equivalences thereof may be used. When the gate electrode is made of a transparent material, the gate electrode 210 may be made of transparent conductive oxide. For example, the gate electrode 210 may comprise at least one transparent conductive oxide selected from indium tin oxide (ITO), indium zinc oxide (IZO), zinc oxide, tin oxide ($SnO_2$), indium oxide ($In_2O_3$), and/or equivalences thereof.

The gate insulating layer 220 covers the gate electrode 210 and the buffer layer 101 located at an outer periphery of the gate electrode 210. The gate insulating layer 220 may be a general oxide layer, a general nitride layer, and/or equivalences thereof.

The light emitting layer 300 is formed on the gate insulating layer 220 correspondingly above the gate electrode 210. The light emitting layer 300 may have both a light emitting function and a semiconductor function. That is, the light emitting layer 300 corresponds to an active layer or a semiconductor layer of a thin film transistor (TFT). The light emitting layer 300 is electrically connected with the source electrode 230 and the drain electrode 240. The size of the light emitting layer 300 may vary according to a size of the pixel. A thickness of the light emitting layer 300 may vary, and may not be particularly limited as long as the light can be emitted.

For example, the thickness of the light emitting layer 300 may be set to about 10 nm to about 500 nm.

In some embodiments, the light emitting layer 300 may comprise an inorganic light emitting material or an organic light emitting material. That is, the light emitting layer 300 may correspond to the semiconductor layer which is the active layer of the thin film transistor (TFT), and when the light emitting layer is made of the inorganic light emitting material, the light emitting layer may correspond to an inorganic semiconductor layer, and when the light emitting layer is made of the organic light emitting material, the light emitting layer may correspond to an organic semiconductor layer.

The light emitting layer 300 may comprise a white light emitting material, and may comprise a red light emitting material, a green light emitting material, or a blue light emitting material. In an embodiment of the present disclosure, the light emitting layer is formed by the white light emitting material.

A light emitting material generally used in the art may be used. Further, a method for forming the light emitting layer using the light emitting material may also use a method generally used in the art.

As compound synthesized by the various methods or a commercially available product may be used as a compound for the light emitting layer 300. As the material for forming the light emitting layer 300, for example, at least one selected from a group consisting of an acene-based material, a thiophene-based material, a fluorene-based material, a polyphenylenevinylene (PPV)-based material, and/or a perylene-based material may be used.

The photonic crystal 400 of the present embodiment is located on the light emitting transistor 40. The photonic crystal may be the photonic crystal 400 illustrated in FIGS. 4A and 4B, may be the photonic crystal 410 illustrated in FIG. 5, or may be one of other photonic crystals known in the art.

Considering periodicity, structure and refractive index, the photonic crystal may be classified into one-dimensional, two-dimensional, and three-dimensional photonic crystals. The one-dimensional photonic crystal may be formed by alternately laminating material layers having different refractive indexes.

In the two-dimensional photonic crystal, there is no change in a z-axial direction, but different structures are periodically arranged on an x-y plane. The two-dimensional photonic crystal may have a structure in which patterns are arranged in two dimensions on a base part. As for the patterns, holes which are arranged two-dimensionally at equal distance may be applied as illustrated in FIGS. 4A and 4B. The pattern may be arranged to reflect 100% of light having a predetermined wavelength or may prevent light in the photonic crystal from leaking outside.

The photonic crystal may have a crystal structure with a lattice distance of several tens of nanometers to several micrometers, and may be able to control a characteristic of ultraviolet light, visible light, and infrared light.

An example method of manufacturing the photonic crystal may include a top-down method such as photolithography and ion-beam etching which has been used in a semiconductor process, and a bottom-up method of arranging nanoparticles having uniform sizes.

The method of manufacturing the photonic crystal using the photolithography or the ion-beam etching methods can delicately make a regular structure, but may have expensive incidental costs and a longer processing time to manufacture a large-area photonic crystal.

A method of manufacturing the photonic crystal through a self-assembly of nanoparticles may not require incidental equipment, and a large-area photonic crystal may be manufactured quickly, but may be difficult to manufacture the large-area photonic crystal without a defect. However, advances in technology have introduced techniques capable of quickly stacking the large-area photonic crystal without a defect through self-assembly of the nanoparticles.

Particularly, researches in manufacturing a photonic crystal using polymer colloid nanoparticles have been conducted, and a precipitation method using gravity, a vertical precipitation method, a vertical precipitation method through temperature distribution, an electrophoretic method, and the like have been studied. The precipitation method using gravity adapts a phenomenon in which self-assembly is performed while particles are precipitated to the bottom by gravity when a solution is dispersed with polymers and silica colloids is left for a long time.

Additionally, the photonic crystal may be formed by using a method of imprinting an upper portion of the base part using a stamp having patterns opposite to the photonic crystal patterns. That is, a method of transferring patterns of the stamp to the base part by indenting the stamp on the layer of the base part may be used.

Further, a photonic crystal having nano patterns may be formed through a simpler process of applying a nano imprinting lithography process technique.

In FIG. 9, an example display device having a top gate light emitting transistor 50 is illustrated. The light emitting transistor 50 includes a light emitting layer 300 formed on a buffer layer 101 of a substrate 100, a gate insulating layer 220 covering the light emitting layer 300, a gate electrode 210 formed on the gate insulating layer 220 correspondingly above the light emitting layer 300, and a source electrode 230 and a drain electrode 240 connected with the light emitting layer 300 while being insulated and spaced apart from the gate electrode 210 by the gate insulating layer 220. Here, the light emitting layer 300 has both a light emitting property and a semiconductor property. The light emitting layer 300 can be made of the same material as the aforementioned material, and further, the source electrode 230 and the drain electrode 240 may be made of the same material as the aforementioned material.

In the display device illustrated in FIG. 9, the photonic crystal 400 may be located below the light emitting transistor 50.

According to an embodiment of the present disclosure, a display device may comprise a light emitting transistor 50, and a photonic crystal 400 located on the light emitting transistor 50. The light emitting transistor 50 includes a gate electrode 210, a gate insulating layer 220 located on the gate electrode 210, a source electrode 230 and a drain electrode 240 located on the gate insulating layer 220 and spaced apart from each other, and a light emitting layer 300 located between the source electrode 230 and the drain electrode 240. In the display device, a position where light is emitted in the light emitting layer 300 varies according to the voltage of the gate electrode 210, and the photonic crystal 400 reflects a different wavelength of light according to a position where the light is irradiated and reflected.

Hereinabove, the present disclosure is described with reference to the embodiments and the drawings. The embodiments and the drawings provide examples for understanding the present disclosure, and the scope of the present disclosure is not limited to the embodiments and the drawings.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims and their equivalents.

What is claimed is:

1. A display device comprising:
a light emitting transistor comprising a light emitting layer; and
a photonic crystal separate from the light emitting transistor, and being on the light emitting transistor,
wherein the photonic crystal has a plurality of patterns varying in size, based on a position of the light emitting layer,
wherein the light emitting transistor comprises:
a substrate;
a gate electrode on the substrate;
a gate insulating layer on the gate electrode;
a source electrode and a drain electrode spaced apart from the gate electrode by the gate insulating layer; and
the light emitting layer between the source electrode and the drain electrode, and
wherein a position of the light emitted in the light emitting layer varies as a function of a magnitude of a voltage applied to the gate electrode.

2. The display device of claim 1, wherein the light emitting layer comprises an organic material.

3. The display device of claim 1, wherein the light is emitted from a side of the light emitting layer adjacent the source electrode when substantially no voltage is applied to the gate electrode, and
wherein increasing a positive voltage applied to the gate electrode within a range of voltages causes a position of the emitted light to move closer to a side of the light emitting layer adjacent the drain electrode.

4. The display device of claim 3, wherein the source electrode comprises a cathode, and
wherein the drain electrode comprises an anode.

5. The display device of claim 1, wherein light emitted by the light emitting transistor is reflected by the photonic crystal.

6. The display device of claim 1, wherein the photonic crystal comprises a base part having the plurality of patterns.

7. The display device of claim 6, wherein a size of each of the patterns increases in a direction from one side of the base part to an opposite side of the base part.

8. The display device of claim 6, wherein each of the patterns comprises a concave groove shape.

9. The display device of claim 8, wherein a diameter of the concave groove shape is in a range from about 100 nm to about 300 nm.

10. The display device of claim 9, wherein the diameter of the concave groove shape increases in a direction from one side of the base part to an opposite side of the base part.

11. The display device of claim 9, wherein a depth of the concave groove shape is in a range from about 100 nm to about 200 nm.

12. A display device comprising:
a light emitting transistor comprising a light emitting layer; and
a photonic crystal separate from the light emitting transistor, and being on the light emitting transistor,
wherein the photonic crystal comprises a base part and a plurality of fine particles on the base part,
wherein the light emitting transistor comprises:
a substrate;
a gate electrode on the substrate;

a gate insulating layer on the gate electrode;

a source electrode and a drain electrode spaced apart from the gate electrode by the gate insulating layer; and a light emitting layer between the source electrode and the drain electrode, and wherein a position of the light emitted in the light emitting layer varies as a function of a magnitude of a voltage applied to the gate electrode.

13. The display device of claim 12, wherein a particle size of the fine particles is in a range from about 100 nm to about 300 nm.

14. The display device of claim 13, wherein the particle size of the fine particles increases in a direction from one side of the base part to an opposite side of the base part.

15. The display device of claim 5, wherein the light reflected from the photonic crystal is displayed, wherein the displayed light at a region adjacent a source electrode is a red-based light, and wherein the displayed light at a region adjacent a drain electrode is a blue-based light.

16. The display device of claim 5, wherein the light reflected from the photonic crystal is displayed, wherein the displayed light in a region adjacent a source electrode is a blue-based light, and wherein the displayed light in a region adjacent a drain electrode is a red-based light.

17. A display device comprising:

a light emitting transistor comprising:
 a gate electrode;
 a gate insulating layer on the gate electrode;
 a source electrode and a drain electrode spaced apart from each other on the gate insulating layer; and
 a light emitting layer between the source electrode and the drain electrode; and a photonic crystal separate from the light emitting transistor, and being on the light emitting transistor,
 wherein the photonic crystal has a plurality of patterns varying in size, based on a position of the light emitting layer, and wherein the position of light emitted in the light emitting layer varies as a function of a voltage of the gate electrode.

18. The display device of claim 17, wherein the gate electrode comprises two or more gate electrodes spaced apart from each other.

* * * * *